United States Patent [19]

Baggen

[11] Patent Number: 4,642,808
[45] Date of Patent: Feb. 10, 1987

[54] DECODER FOR THE DECODING OF CODE WORDS WHICH ARE BLOCKWISE PROTECTED AGAINST THE OCCURRENCE OF A PLURALITY OF SYMBOL ERRORS WITHIN A BLOCK BY MEANS OF A REED-SOLOMON CODE, AND READING DEVICE FOR OPTICALLY READABLE RECORD CARRIERS

[75] Inventor: Constant P. M. J. Baggen, Eindhoven, Netherlands

[73] Assignee: U.S. Philips Corporation, New York, N.Y.

[21] Appl. No.: 824,299

[22] Filed: Jan. 30, 1986

Related U.S. Application Data

[63] Continuation of Ser. No. 562,611, Dec. 19, 1983, abandoned.

[30] Foreign Application Priority Data

Jun. 22, 1983 [NL] Netherlands .......................... 8302214

[51] Int. Cl.<sup>4</sup> ............................................. G06F 11/10
[52] U.S. Cl. .......................................... 371/39; 371/37
[58] Field of Search ...................... 371/37, 38, 39, 40

[56] References Cited

U.S. PATENT DOCUMENTS

3,648,236  3/1972  Burton ................................. 371/37
4,142,174  2/1979  Chen et al. ........................... 371/37
4,468,769  8/1984  Koga ................................... 371/37

OTHER PUBLICATIONS

Clark, Jr. et al., Error-Correction Coding for Digital Communications, Plenum Press, New York, 1981, pp. 188-223.
Berlekamp, Algebraic Coding Theory, McGraw-Hill, 1968, pp. 176-199.

*Primary Examiner*—Charles E. Atkinson
*Attorney, Agent, or Firm*—Jack E. Haken; James J. Cannon, Jr.

[57] ABSTRACT

A decoding system for code words which are protected against the occurrence of a plurality of symbol errors within a code word by means of a Reed-Solomon code. After the formation of the syndrome symbols, the key equation is solved, assuming the least possible number of symbol errors. When a plausible number L is found using 2L syndrome symbols, an additional number of syndrome symbols is considered for determining the discrepancy quantity. The locator equation is directly solved when it is of a low order. For a higher order, a Chien search cycle is performed and any symbol error found is removed by division until the order becomes low enough for direct solution. The decoding system is suitable for implementation by means of a microcomputer and for use in a reading device for optically readable record carriers.

11 Claims, 14 Drawing Figures

```
0     0 0 0 0 a⁰    0 0 0 1     a⁴    0 0 1 1     a⁸    0 1 0 1     a¹²   1 1 1 1 a¹    0 0 1 0     a⁵    0 1 1 0     a⁹    1 0 1 0     a¹³   1 1 0 1 a²    0 1 0 0     a⁶    1 1 0 0     a¹⁰   0 1 1 1     a¹⁴   1 0 0 1 a³    1 0 0 0     a⁷    1 0 1 1     a¹¹   1 1 1 0     a¹⁵   0 0 0 1
```

$$\sigma(z) * S(z) = \omega(z)$$

$$\begin{Bmatrix} S_9 & S_8 & S_7 & & S_2 & S_1 & S_0 \\ S_{10} & S_9 & S_8 & & S_3 & S_2 & S_1 \\ S_{11} & S_{10} & S_9 & & S_4 & S_3 & S_2 \\ & & & & & & \\ S_{18} & S_{17} & S_{16} & & S_{11} & S_{10} & S_9 \end{Bmatrix} * \begin{Bmatrix} \sigma_1 \\ \sigma_2 \\ \sigma_3 \\ \vdots \\ \sigma_{10} \end{Bmatrix} = \begin{Bmatrix} S_{10} \\ S_{11} \\ \\ \\ S_{19} \end{Bmatrix}$$

$$\begin{Bmatrix} S_2 & S_1 & S_0 \\ S_3 & S_2 & S_1 \\ S_4 & S_3 & S_2 \\ & & \\ S_{18} & S_{17} & S_{16} \end{Bmatrix} * \begin{Bmatrix} \sigma_1 \\ \sigma_2 \\ \sigma_3 \end{Bmatrix} = \begin{Bmatrix} S_3 \\ S_4 \\ S_5 \\ \\ S_{19} \end{Bmatrix}$$

$$\frac{\begin{bmatrix} S_9 & S_{10} & S_7 & & S_2 & S_1 & S_0 \\ S_{10} & S_{11} & S_8 & & S_3 & S_2 & S_1 \\ S_{11} & S_{12} & S_9 & & S_4 & S_3 & S_2 \\ & & & & & & \\ S_{18} & S_{19} & S_{16} & & S_{11} & S_{10} & S_9 \end{bmatrix}}{\begin{bmatrix} S_9 & S_8 & S_7 & & S_2 & S_1 & S_0 \\ S_{10} & S_9 & S_8 & & S_3 & S_2 & S_1 \\ S_{11} & S_{10} & S_9 & & S_4 & S_3 & S_2 \\ & & & & & & \\ S_{18} & S_{17} & S_{16} & & S_{11} & S_{10} & S_9 \end{bmatrix}} = \sigma_2$$

DECODER FOR THE DECODING OF CODE WORDS WHICH ARE BLOCKWISE PROTECTED AGAINST THE OCCURRENCE OF A PLURALITY OF SYMBOL ERRORS WITHIN A BLOCK BY MEANS OF A REED-SOLOMON CODE, AND READING DEVICE FOR OPTICALLY READABLE RECORD CARRIERS

This is a continuation of application Ser. No. 562,611, filed Dec. 19, 1983, now abandoned.

BACKGROUND OF THE INVENTION

1. Field of the Invention

The invention relates to a decoding system for the decoding of code words which are protected against the occurrence of a plurality of symbol errors within a code word by means of a Reed-Solomon code, said decoding system comprising receiving circuits for the sequential reception of the code symbols in order to form a code word therefrom, first calculating circuits for determining a series of syndrome symbols from the code word by way of the parity check matrix [H] of the code, second calculating circuits which are fed by the first calculating means in order to solve the key equation for obtaining the error locator sigma(z) and the error evaluator omega(z), third calculating circuits which are fed by the second calculating means for determining the zero positions of the error locator in order to obtain the positions of possibly incorrect code symbols, and fourth calculating circuits which are fed by the third calculating circuits in order to determine the symbol errors associated with incorrect code symbols from said zero points, code symbols which are correctable by way of error value (values) and location data of symbol errors, being presented to a user output.

2. Description of the Prior Art

A decoding system of this kind is known from U.S. Pat. No. 4,142,174 which describes a fast decoding method for the correction of at most three symbols in a code word. This capability is inadequate in given cases.

SUMMARY OF THE INVENTION

It is an object of the invention to provide a decoding system which is capable of operating at a high speed and in which the processing speed is adapted to the actual number of errors found, so that it is not always necessary to take into account the worst case in which the correction capability of the code is fully utilized; this is achieved by simplification of the solution of the key equation, said simplification being structured so that the results of preceding calculating steps are used for subsequent calculating steps so that a nested structure is obtained, while for a given number of provisionally detected symbol errors only a limited number of additional syndrome symbols, said number usually being smaller than the number of syndrome symbols present for the word, is used for testing the correct solution of the key equation. The object is achieved in that in accordance with the invention the second calculating circuit comprises multiplier means for solving, for an assumed number of (L) symbol errors per code word and starting from a correct code word (L=0), the reduced key equation which is limited to the taking into account of 2L syndrome symbols according to Cramer's rule, but for solving a further, less reduced key equation in the case of a discrepancy delta 1 which deviates from zero, the latter solution involving the introduction of two further syndrome symbols in the current reduced key equation and matrix incrementation operations, in order to determine for a discrepancy delta 1 which is equal to zero, a number of (Nmax) of discrepancies delta 1 which is determined by the value of the number of symbol errors then assumed thus far, said discrepancies being based on successively incremented numbers of assumed pseudo-symbol errors, but to determine in the case of a discrepancy delta 1 which still deviates from zero supplements to the key equation for all non-treated numbers up to the actual incremented number of symbol errors, and to solve this supplemented key equation in the described manner. In practice the worst case will only rarely occur in a succession of code words, because a large number of errors in a code word is almost always less liable to occur than a small number of errors.

Preferably, the second calculating circuits comprise first detection circuits for detecting a found number of no more than two symbol errors, said second calculating circuits directly solving an error locator equation of at the most the second order in order to localize and evaluate the errors directly, but calculating the error evaluator in the case of a larger number of detected symbol errors. In many cases only few symbol errors occur; the above procedure then represents a time saving. The procedure according to the present state of the art itself is also short in the case of a small number of symbol errors, but this technique does not have the capability of performing a correction when a larger number of errors is detected. In accordance with the described method, an adapted number of steps is performed for any quantity of errors.

Preferably, the third calculating circuits comprise second detection circuits for detecting a found number of three symbol errors, said third calculating circuits solving a cubic error locator equation, and localizing the errors, after which values are assigned thereto, however said third calculating implementing a Chien search cycle over the series of code symbols in the case of a detected larger number of detected symbol errors until a symbol error is localized, and removing the factor represented by said localized symbol error from the error locator by division, so that the actual number of remaining symbol errors is reduced by one unit, the error locator equation being directly solved when a predetermined number of remaining symbol errors is reached. The Chien search method per se is very suitable, notably in the case of a large number of maximally correctable errors per code word (ten in the preferred embodiment), but it is also time consuming and the method followed herein offers a substantial time saving in the vast majority of cases.

Preferably, said first calculating circuits comprise a loop which includes a series connection of an EXCLUSIVE-OR circuit for receiving the code symbols, a buffer for storing the (provisional) syndrome symbols formed for a code word, and a read-only memory for the storage of the multiplication tables for the parity check matrix, an output of said read-only memory being fed back to a further input of the EXCLUSIVE-OR circuit, a further output of the buffer being connected to the second calculating circuits in order to apply thereto the series of final syndrome symbols upon completion of the treatment of the relevant code word. This offers an inexpensive solution which is capable of coping with the required high throughput speed.

Preferably, for the detection of the last code symbol of a code word on the basis of an appended signal bit there is provided a signal detector, an output of which activates the further output in order to enable said circuit for the reception of a next code word. Such signalling enables a simple implementation for the detection of the end of a code word. It notably enables the treatment of a succession of code words of mutually different lengths without these lengths having to be known in advance.

Preferably, the second, third and fourth calculating circuits are realized by means of a calculating circuit which comprises: an input buffer for the storage of at least the complete series of syndrome symbols generated for a code word, a microcomputer, an output buffer for the storage of a series of error locator and error evaluator symbols generated for a complete series of syndrome symbols associated with a code word, and a bus which is connected between these components and whereto there is also connected a log/antilog table device for executing multiplication operations on the symbols in the relevant Galois field, and a data memory for which addresses can be supplied by the microcomputer via the bus and also by a counter which can be incremented by an external clock generator. It has been found that an average error rate can be suitably dealt with by using such simple means and buffering, the buffer (buffers) being completely filled only in the case of comparatively long series of substantially disturbed code words. The table device in the present embodiment is also used for the storage of further quantities (the C, D and K tables to be described later). Thanks to the ample addition of buffers, pipeline operation can also be attractively realized.

Preferably, there is also connected to the bus a detector (362) for detecting a correct code word by detection of a series of syndrome symbols associated with a code word and containing exclusively "zero" symbols and without using the microcomputer a next series of syndrome symbols, being subsequently called. This results in very fast detection of correct code words. In principle words will occur often, so that a small addition to the circuit has a comparatively large effect in increasing the processing speed. This signalling is also used in the present embodiment for the fast control of the execution of the transfer of the error indicating series of symbols to a user device.

The invention also relates to a reading device for optically readable record carriers which includes a decoding system of the described kind and which comprises positioning means for accommodating such a record carrier, drive means for rotating the record carrier about its axis of rotation at a substantially uniform speed, and read means for reading a bit series from a track on the record carrier with series/parallel conversion for presentation to said first calculating means. This represents a simple application of the invention, the more so as the storage density of data on such a record carrier on the one hand is high but on the other hand susceptible to errors; the reliability is thus substantially improved.

BRIEF DESCRIPTION OF THE FIGURES

The invention will be described in detail hereinafter with reference to some Figures. First of all the code will be explained in general terms, and after that the device used and the calculation and hence the correction of the errors will be explained.

FIG. 8a shows the key equation and the solution method to be used;

BRIEF DESCRIPTION OF A CODE TO BE USED

Figures 1, 2:
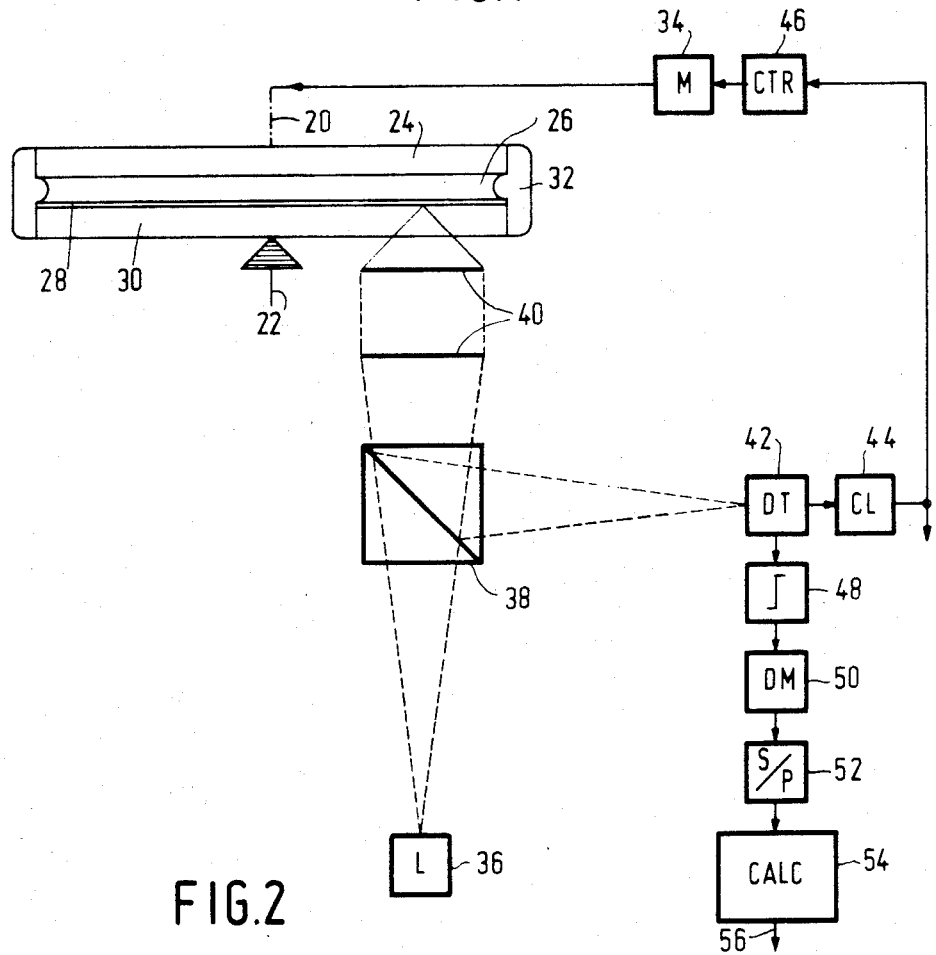
FIG. 1 shows an example of a parity check matrix [H] of the code.
FIG. 2 shows a player for a record carrier for digital optical recording.

FIG. 1 shows an example of a parity check matrix [H] of a so-called Reed-Solomon block-wise code. A generator matrix [G] for this code is given by $[G] \times [H] = 0$, the number of rows k of the matrix [G] being equal to the number of k data symbols in a code word or block, the number of n columns being equal to the total number of symbols in a code word, including the redundant symbols. For the sake of simplicity, only systematic codes at the symbol level will be considered herein. The generator matrix can be multiplied, without modification of the code properties, by a transposition matrix, so that the location of the rows changes. The matrix elements are elements of a Galois field and consist of a number of m bits, so that $2 \exp (m) > (n)$. The Galois field is generated by an associated primitive and irreducible polynominal. The four arithmetical operations for the elements of this Galois field are defined. If the number of symbols to be corrected per code word equals t, $(n-k) > (2t-1)$, where $n > k > 0$. The number of redundant symbols usually amounts to twice the maximum number of symbol errors to be corrected. The quantity "d" is the so-called "code distance" and $d - 1 \leq n - k$, when $2t < d$; the extent in which the code distance is used for the correction can be chosen.

DESCRIPTION OF THE PLAYER

FIG. 2 shows a player for a record carrier for digital optical recording. The record carrier, being readable on two sides in some versions, comprises a cover plate 24, a hollow space 26 which may be filled with an inert gas, for example, argon, a layer 28 which contains tellurium, and a substrate 30. The hollow space is bounded by a sealing ring 32 which provides airtight sealing. The data is contained in holes in the layer containing tellurium, said holes being formed by burning-in during the write operation. The reflection of incident light at the area of a hole is substantially reduced. On the record carrier there may be provided a polymer coating on which a read track is defined by way of a groove. The record carrier is disc-shaped and journalled on a bearing 22 (diagrammatically shown), the disc being driven by a motor 34 on a shaft 20. Only the read operations will be considered hereinafter. During rotation of the disc the read laser 36 continuously emits light and illuminates a circular or spiral track via a semitransparent prism 38 and a lens system 40 which comprises a microscope objective. Via the lens system 40 and the semitransparent prism 38, reflected light is conducted to the detector 42. From the detected signal the clock signal is recovered by a clock extraction mechanism 44 in order to readjust the number of revolutions of the motor via a control element 46. For the sake of brevity, neither the exact nature of this readjustment nor the mechanism for tracking in the radial and the axial directions, defined with respect to the disc, and for maintaining correct focussing will be elaborated herein.

In a discriminator 48 the output signal of the detector 42 is converted into a binary high/low signal with interference-suppressed transitions. This signal consists of channel bits. The stream of channel bits satisfies predetermined conventions which are related to the channel properties and which are irrelevant for the further description. In an element 50 the stream of channel bits is demodulated; during this operation an amount of redundancy is removed so that only the code bits remain. In a series/parallel converter 52, the stream of code bits is converted into 8-bit code symbols which are ultimately applied to a decoder 54 for correction/detection of errors. Further, symbol-wise organized redundancy is removed in the device 54, so that the data symbols for a user appear on an output 56. The correction may alternatively be performed elsewhere. The mutual synchronization of the operation of the elements 48–54 has been omitted for the sake of simplicity. In a more elaborate version, several bit elements of the disc are converted into code bits together, but this operation will not be elaborated herein for the sake of simplicity.

DESCRIPTION OF THE CALCULATING MEANS

Figures 3, 4:
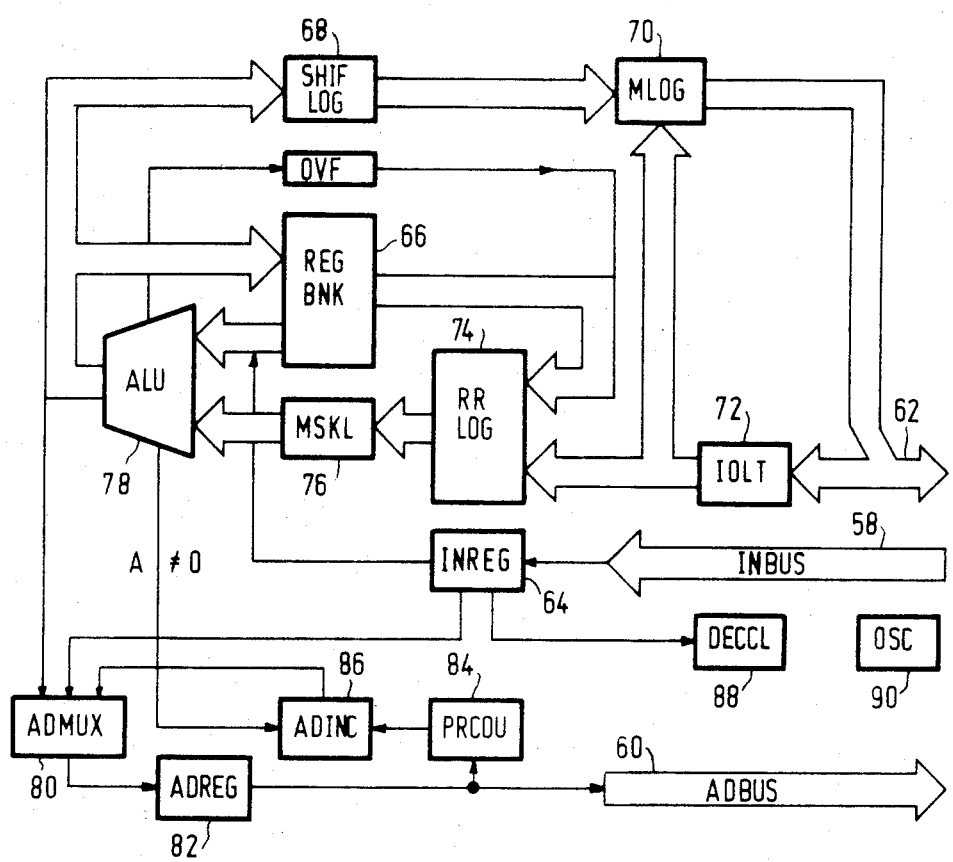
FIG. 3 shows a block diagram of a microcomputer to be used.
FIG. 4 shows an example of the elements of a Galois field $GF(2^4)$.

FIG. 3 shows a block diagram of a microcomputer with peripheral equipment for use in the decoder 54. In the present embodiment, the calculations are performed in a microcontroller type 8×300 or 8×305, made by Signetics Corporation, 811 East Arques Av., Sunnyvale, Calif., USA, described in the manufacturer's manual. This component is notably suitable for the execution of sixteen-bit instructions transported via the bus 58. There are also provided a thirteen-bit bus 60 for instruction addresses and a bidirectional eight-bit bus 62 for data input/output. The microcontroller also comprises an instruction register 64, several general registers 66, shift logic 68, merge logic 70, an input/output buffer 72, rotation logic 74, mask logic 76, an arithmetic and logic unit 78, an address multiplexer 80, an address register 82, a program counter 84, address incrementation logic 86, and general decoding and control logic 88; an external oscillator/timer 90 must be provided. The description of the operation of this controller will be omitted for the sake of brevity. For the storage of data use is made of a read/write memory which has a maximum capacity of 256 8-bit words and for which data and addresses are transported via the data bus in a time multiplex organization. The instruction time is 250 ns and the microprocessor memory is easy to program.

FIG. 4 shows a table in order to elucidate the operations on the symbols which in this case consist (by way of example) of only four code bits (the symbols actually consist of 8 bits, so that there are 256 different data contents). The Galois field $GF(2^4)$ thus consists of sixteen symbols in this case and is generated by the primitive and irreducible polynominal which is formed as $x^4+x+1$. In this case, and also in $GF(2^8)$, there exists more than one possibility for this polynominal. The elements of the Galois field are given twice, once as a series of powers of the primitive element a and once as a vector representation, that is to say as a bit series associated with each relevant power of a. The four arithmetic operations are defined within a Galois field. Addition and subtraction can be bit-wise performed in the microcomputer; for example: $(0110)+(1011)=(1101)$, the addition being performed bit-wise modulo-2. Multiplication and division are facilitated by the use of logarithms having the base a. In a log table the code symbol acts as the address and the exponents of the base act as data. In an antilog table, this exponent acts as the address and the exponents of the base act as data. In an antilog table, this exponent acts as the address and the code symbol as data.

EXAMPLE $(0110) \times (1011)$ results in $a(\exp 5) \times a(\exp 7) = a(\exp 12)$ so $(1111)$ Division is performed similarly by calculating modulo $2 \exp (m) - 1$ then, so in this example $m=4$.

Figure 5:
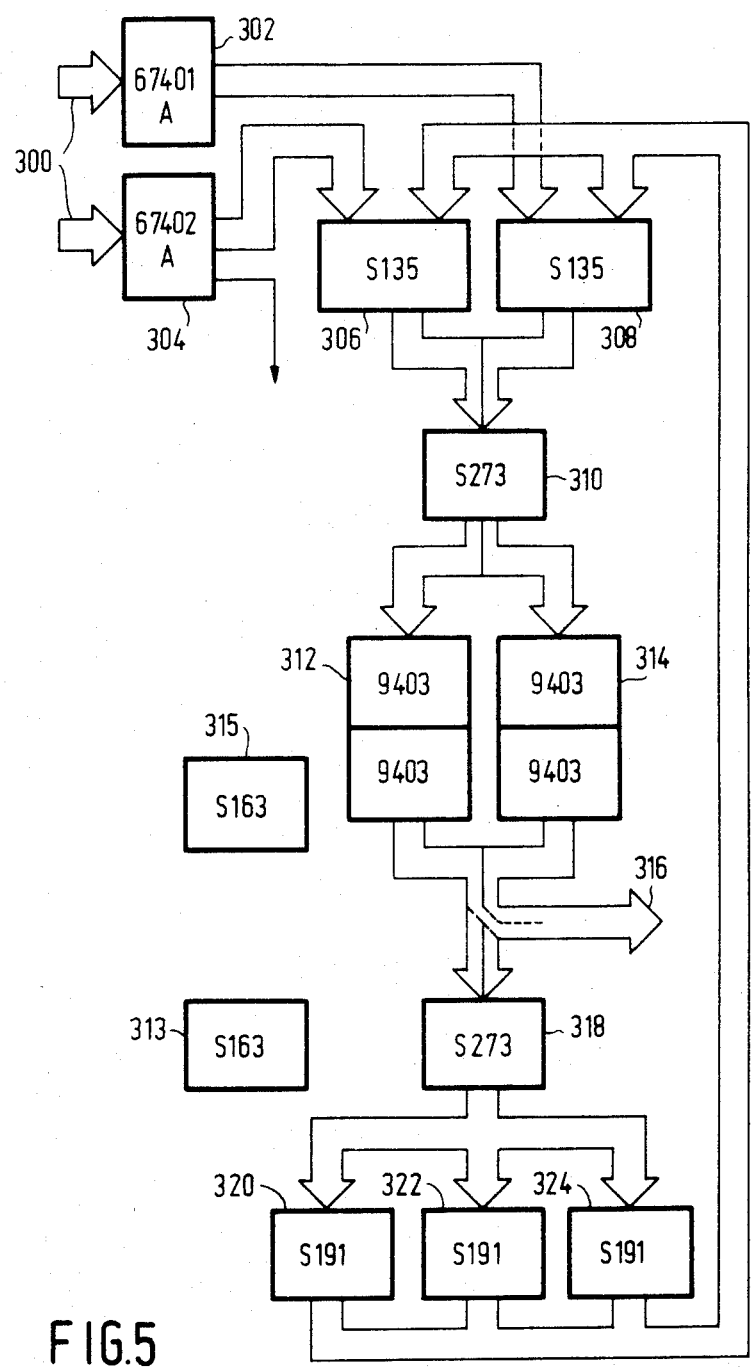
FIG. 5 shows a device for calculating the syndrome symbols.

FIG. 5 shows a device for calculating the 20 syndrome symbols per code word. This device has two modes of operation: during the first mode the symbols of a frame or code word are received and during the directly subsequent second mode the twenty syndrome symbols are presented on an output for further processing. The data arrives byte-serially on an input 300 and is temporarily stored in two FIFO memories 302, 304, made by M.M.I. Corporation; in this section the width of the symbols amounts to 8 bits, and a ninth bit is added, said ninth bit normally having the value zero, but the value 1 for the last symbol of a frame. The outputs of the FIFO memories are connected to two components 306, 308; these are components of the known TTL series of Texas Instruments Corporation, type SN74S135, having the quadruple EXCLUSIVE-OR/NOR function; the indication "S135" used is an abbreviation. The additional bit which indicates the last symbol is applied to the sequencer to be described hereinafter. Elements 313, 315 of the type S163 control the selection of the table devices 320, 322, 324; each time when a new code symbol is presented on the output 302, they are reset to zero. Element 310 of the type S273 operates with a data width of 8 bits and is formed as a resettable eightfold data flip-flop. Each of the elements 312, 314 operates on four bits in parallel and forms a FIFO memory of the type FAIRCHILD 9403 having a data depth of $2 \times 12 \times 24$ symbols. The output thereof is connected to a component 318 of the same type as the component 310; on the other side the output of the elements 312, 314 and 316 is available for the connection of further components (in FIG. 6) for outputting the syndrome symbols. The components 320, 322, 324 are programmable read-only memories (PROM) of the type INTEL3636B, each of which has a capacity of $2k \times 8$ bits. These memories contain the elements of the parity check matrix. When the first code symbol is received, all syndrome symbols have the value zero. Each of these provisional syndrome symbols is multiplied by the associated row of the parity check matrix, each product thus formed being added to the newly received code symbol in order to form a further syndrome symbol. For each code symbol received twenty syndrome symbols are thus reconstructed. After the reception of the last code symbol, the twenty final syndrome symbols are ready for further processing. The capacity of the buffer 312/314 suffices for the twenty syndrome symbols; in fact, the excess capacity is four syndrome symbols, as explained on page 14, line 26. The excess capacity is not used. The time control applies, under the control of the ninth symbol bit which identifies the last symbol of the code word, so after the formation of the final syndrome symbols, a transfer control signal to the circuit shown in FIG. 6 in order to transfer the syndrome symbols to inputs 334,336 which are connected to the output 316.

Figure 6:
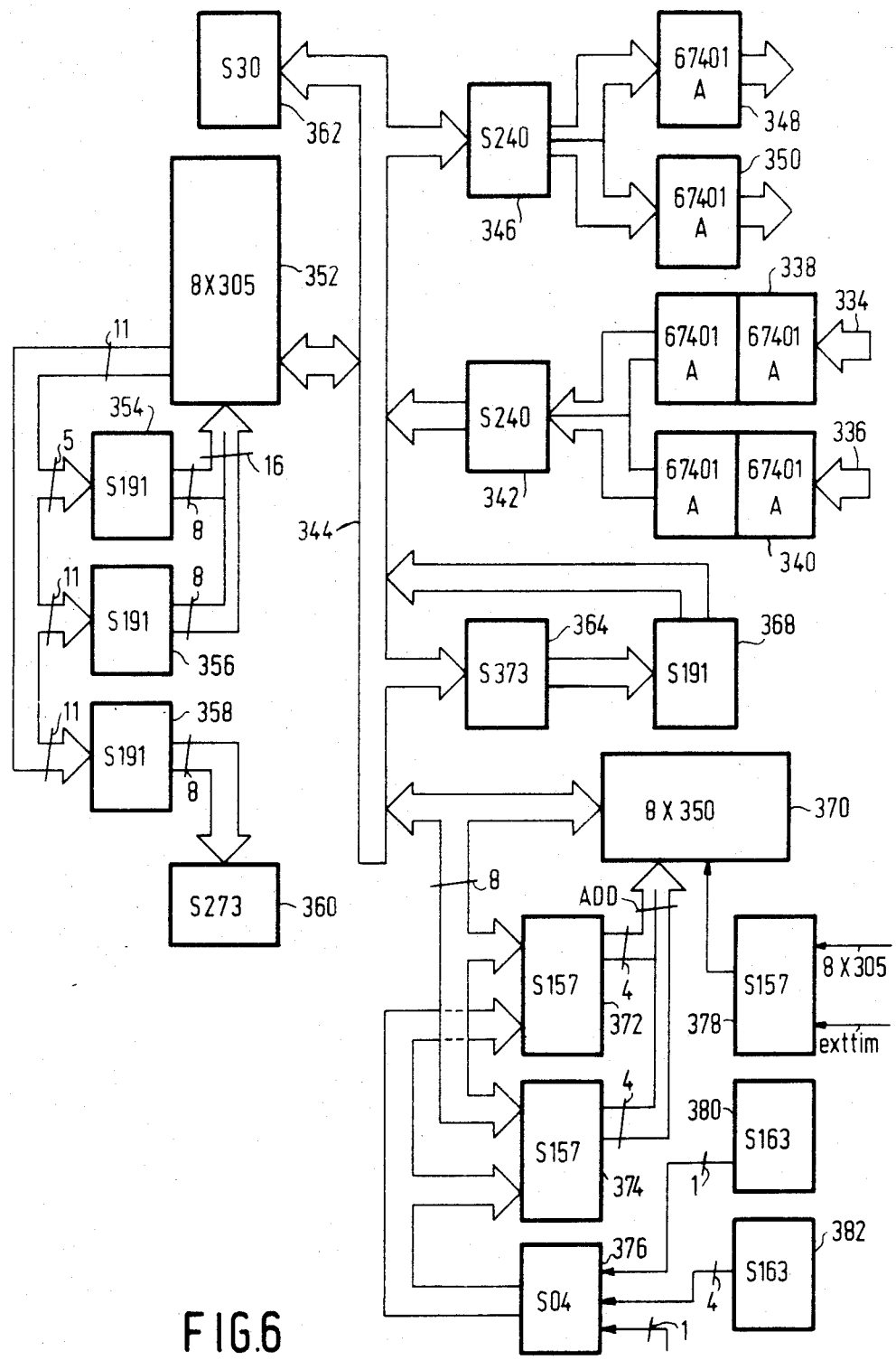
FIG. 6 shows a device for executing calculations in a Galois field.

FIG. 6 shows a device for performing calculations in a Galois field which is fed, via the inputs 334, 336 having a combined width of 8 bits, by the output 316 of FIG. 5. Elements 338, 340 again form a FIFO buffer having a data depth of $2 \times 64 = 128$ symbols. This suffices for more than six frames, so that a safety margin is obtained. Should a frame contain only few incorrect symbols, then the processing in the circuit of FIG. 6 will be very fast; however, the duration of processing becomes longer as the number of incorrect symbols increases. Thanks to the buffering, in the circuit of FIG. 6 the mean frame processing time over six successive frames need merely correspond to the input rate on input 300. If this means value were to become too high, the buffer would overflow; in that case the input 300 is blocked as yet, which means that the record carrier must make an additional revolution during which no further data can be output. Component 342 is an inverting buffer which has a width of 8 bits and which comprises a tristate output (low, high and terminated by a high impedance, respectively), its output being connected to an eight-bit bus 344. Inverted data signals are transported on this bus. The data output is similarly formed by an eight-bit buffer 346 and a FIFO buffer 348, 350 having a data depth of 64 symbols. Therein the data appear which identify possibly incorrect symbols, i.e. in succession the position of the incorrect code symbol and the value of the error. The value should be added bit-wise modulo-2 to incorrect symbol in order to obtain the correct value. In accordance with the convention used herein, the data for each frame or code word is formated as follows:

00, error indication series (xi, yi), 00.

Consequently, for zero errors this means the series 00, 00. For each incorrect symbol, two additional symbols are included in this series: first the error location xi and then the error value yi. For a non-correctable code word, the series is FF,00. The microcomputer 352 of FIG. 3 is provided to execute the actual calculations. Its data connection is connected to the bus. Furthermore, the address output (only the eleven least-significant bits of the address are used) is connected to the PROM memories 354, 356, 358 or type S191 or type 3636. The first two memories thereof are used to produce, connected in parallel, instructions having a width of 16 bits on the instruction input of the microcomputer 352. The third PROM memory 358 is used to generate further control signals. These signals can thus be very quickly provided without transport via the bus 344 being required; this is because the latter would be comparatively slow. Connected to the output of the PROM memory 358 is a resettable flip-flop circuit 360 of the type S273 which has a width of 8-bits for the buffering of the control data for other parts of the circuit; the availability of this control data is thus improved and the circuit can operate faster than if this facility were not provided; this is because this data can be made available in advance, so that it will not be necessary to perform a computer cycle at the very last instant.

The bus is also connected to the component 362 which forms an eight-input NAND-gate, so that it can be detected whether or not a data byte having the value zero is present on the bus. This component forms a detector for the zero state of syndrome symbols and error locations for the sequencer. In many cases a frame received will be correct; all syndrome symbols are then equal to zero and the set of syndromes of the next frame can be directly dealt with without the microcomputer having to perform a multitude of calculations. Element 364 is an eight-fold transparent latch circuit which serves as an address register for the PROM memory 368 of the described type. This memory contains log and antilog tables of the described kind for the relevant Galois field, and also tables for the quantities "C", "D" and "K" yet to be described. Using the loop thus formed, data conversion can be very quickly performed; during this operation an additional control signal from the element 360 indicates the conversion category (5 different categories).

Element 370 is a RAM memory of the type $8 \times 350$ which has a capacity of $256 \times 8$ bits and can be driven at a clock frequency of up to 10 MHz; this clock signal is generated externally and also controls the time control and the formation of the syndrome symbols. The eight-bit addresses can be applied in a first mode via the bus 344 by means of two parallel-connected multiplexers 372, 374 of the type S157 which are controlled by output signals of the element 360. These multiplexers can receive alternatively address data from the element 376 of the type S04 which is a six-fold inverter. The latter receives the data from two parallel connected four-bit counters 380, 382 of the described type, only five output bits of which are used in parallel. The sixth address bit is formed by the time control. Thus, series of addresses can be read from and written into the memory 370 in a very rapid succession without address transport being required via the bus 344. Element 378 is a multiplexer of the described type which is fed by control output signals of the microcomputer 352 or by signals from the external time control. This element also serves for the control of the memory 370 in which it can store different types of intermediate data in relevant parts of this memory. The different mode control bits can be supplied by this mechanism. Elements 380, 382 are counters (see FIG. 5); the output signals thereof are applied to the latch circuit 378 and further to the multiplexers 372, 374, so that different modes can be controlled in very rapid succession. Thanks to the described organization, notably address sequences can be very rapidly accessed in an intermingled manner in different parts of the memory 370.

THE CALCULATION OF THE ERRORS

The present embodiment utilizes a code word which comprises n code symbols and which is protected against at the most 10 arbitrarily disturbed code symbols in accordance with a systematic code using twenty redundant code symbols. Without additions the device would be capable of processing a number of 24 redundant code symbols; this is determined inter alia by the capacities of the elements 320, 324, 312, 314 in FIG. 5. For theoretical reasons the length of the code word may be extended to at the most 255 code symbols, but the smallest sensible length of a code word is 21 symbols, that is to say 1 data symbol and 20 redundancy symbols. All symbols consist of 8 bits. The generator polynomial of the code used is as follows:

$$g(x)=(x-a^0)(x-a^1)\ldots(x-a^{19})$$

the product being calculated again in $GF(2^8)$. All correct code words are a multiple of this generator polynomial and have the same zero points as the generator polynomial.

Figure 7:
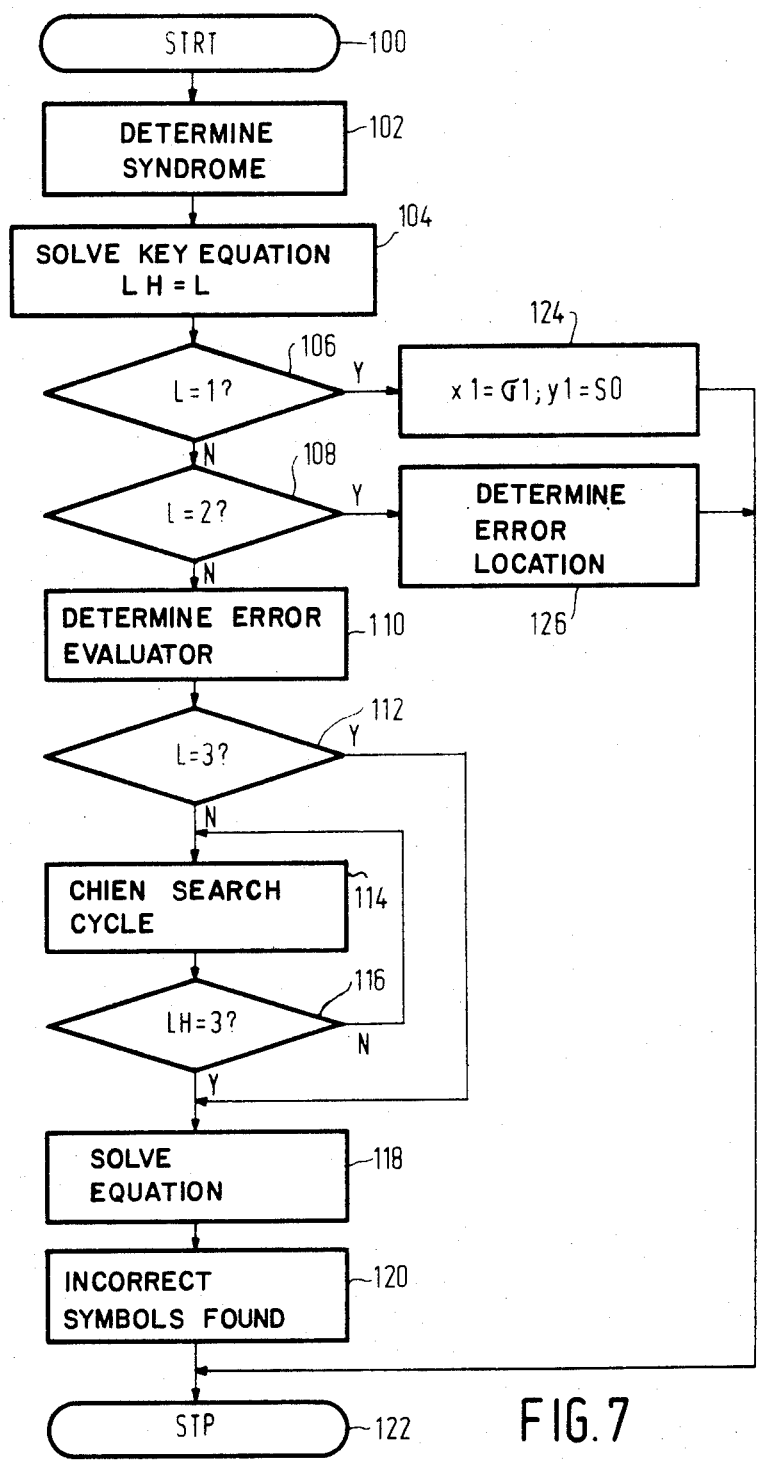
FIG. 7 shows a overall flowchart of the error correction operations.

FIG. 7 shows a general flowchart of the error correction operation. The operation is started in block 100 and at the end thereof the entire code word is available, for exfor the processing in the circuit of FIG. 5. Using multiplication by the parity check matrix [H], in block 102 the syndrome is determined, i.e. $(n-k)=20$ symbols in the preferred embodiment. This operation is performed in the circuit of FIG. 5 and in the relevant Galois field.

The further operations are performed in the circuit shown in FIG. 6. First of all the key equation is solved in block 104; this equation is as follows:

$$[1+S(z)]\times \text{sigma}(z)\#\text{omega}(z)\bmod z^{(2t+1)},$$

see the book "Algebraic Coding Theory" by Erwin P. Berlekamp, McGraw Hill, p. 178 ff. It has been demonstrated that for each correctable error pattern the polynomials sigma(z) and omega(z) can be found, the quantity S(z) being the polynomial formed by the syndrome symbols.

The quantity sigma(z) is the error locator polynomial. The quantity omega(z) is the error evaluator polynomial; both polynomials must be calculated for determining the correction. In Berlekamp's notation, the connecting symbol # means "is congruent with" which means: there is a polynomial C(z), so that the left term of the expression equals $C(z)\times z^{(2t+1)}+\text{omega}(z)$. It is to be noted that the term "1+S(z)" in the key equation may be replaced by "S(z)"; if a value is inserted for z for which an error has occurred, there the locator polynomial also has the value zero.

Subsequently, an error enumerator L is postulated: this numerator provides a current estimate of the order of the error locator polynomial. If this order equal zero, all syndrome symbols themselves are also equal to zero and the code word is considered to be correct; this is not separately shown in the flowchart; the system may then proceed directly to block 122: stop.

The error correction strategy is as follows: a search is made for the simplest error pattern (smallest number of incorrect symbols) which is not in conflict with the syndrome pattern found; the idea is that a smaller number of errors is almost always more likely to occur than a larger number of errors. The syndrome polynomial is then represented as the quotient of two other polynomials of the simplest possible form, notably: of an as low as possible order. When a solution is found with a given number of symbol errors, a non-exhaustive attempt is made, by taking into account a limited number of further syndrome symbols, to detect whether a further solution exists. In principle it is often possible to find a code word which has a more complex error pattern and which satisfies the same syndrome configuration, but the chance of such an error per se is very small and, moreover, chances are small that the postulated number of errors is still within the correctable value range. Finally, in block 104 the auxiliary error enumerator LH becomes equal to the error enumerator L. After completion of the block 104, the number of symbol errors is then known.

In block 106 it is detected whether the number of errors equals "1". If this is so, the error locator and the error value of the one incorrect symbol are directly determined in block 124. If the result in block 106 is negative (N), it is detected in block 108 whether two symbol errors have occurred. If the result of this detection is positive (Y), in block 126 the locations of the two incorrect symbols can be found by solution of a quadratic equation (see FIG. 10); their values can be determined by way of the values of the syndrome symbols (block 126). If the error enumerator is larger than two, this operation cannot be directly performed by means of the method shown, so that it is first necessary to determine the error evaluator in block 110; this is described in greater detail with reference to FIG. 11. After completion of the block 110, it is detected in block 112 whether the error enumerator L has the value "three". If the result of this detection is positive (Y), the system proceeds to block 118. If the result of the verification is negative (N), a Chien search cycle is performed in the block 114. When an incorrect symbol is thus found, the relevant zero point is removed by division so that the order of the error locator is decremented by one unit. The auxiliary error enumerator is then also decremented. This search cycle will be described in detail with reference to FIG. 12. The auxiliary error enumerator indicates the number of errors still involved in the error locator. In block 116 it is detected whether the auxiliary error enumerator now has the value "three". For as long as the result remains negative, the system (each time) returns to the block 114 in order to execute a further Chien search cycle. For example, when there are ten incorrect symbols, the block 114 must be completed seven times. When the verification in block 116 has a positive result, the remaining equation is solved in block 118. Finally, proceeding from block 118, the actual incorrect symbol values are found in block 120. This already took place in the blocks 124, 126 for the cases involving 1 or 2 errors. In block 122 the entire code word has been corrected and generally a new series of syndrome symbols may be fetched from the buffer when the code word just treated was not the last code word to be treated.

The actual correction is not performed in the circuit shown in FIG. 6, but only the error locations Xi and the error values Yi are delivered to the system for further use. The simplified flowchart of FIG. 7 does not contain the blocks for detecting whether an error correction has become impossible. It appears that a fast process is created by substantially avoiding the operations in block 114. This is because always the value LH=3 is tested and in most cases the test result will already be positive after one of the first passages through this block. The flowchart shown may be modified. It is to be taken into account, however, that the Chien search cycles are comparatively long so that they may consume a large part of the processing time. However, in the block 116 it could be tested whether the auxiliary error enumerator is equal to 2 or 1, so that subsequently a second order or first order, equation, respectively, need be solved. It is in principle also possible to solve an error locator of the fourth or a higher order "directly" without performing the Chien search cycles; however, this procedure is very complex. The value range to be chosen will sometimes depend on the microcomputer available or on the properties of the channel causing the errors.

SOLUTION OF THE KEY EQUATION

Figure 8B:
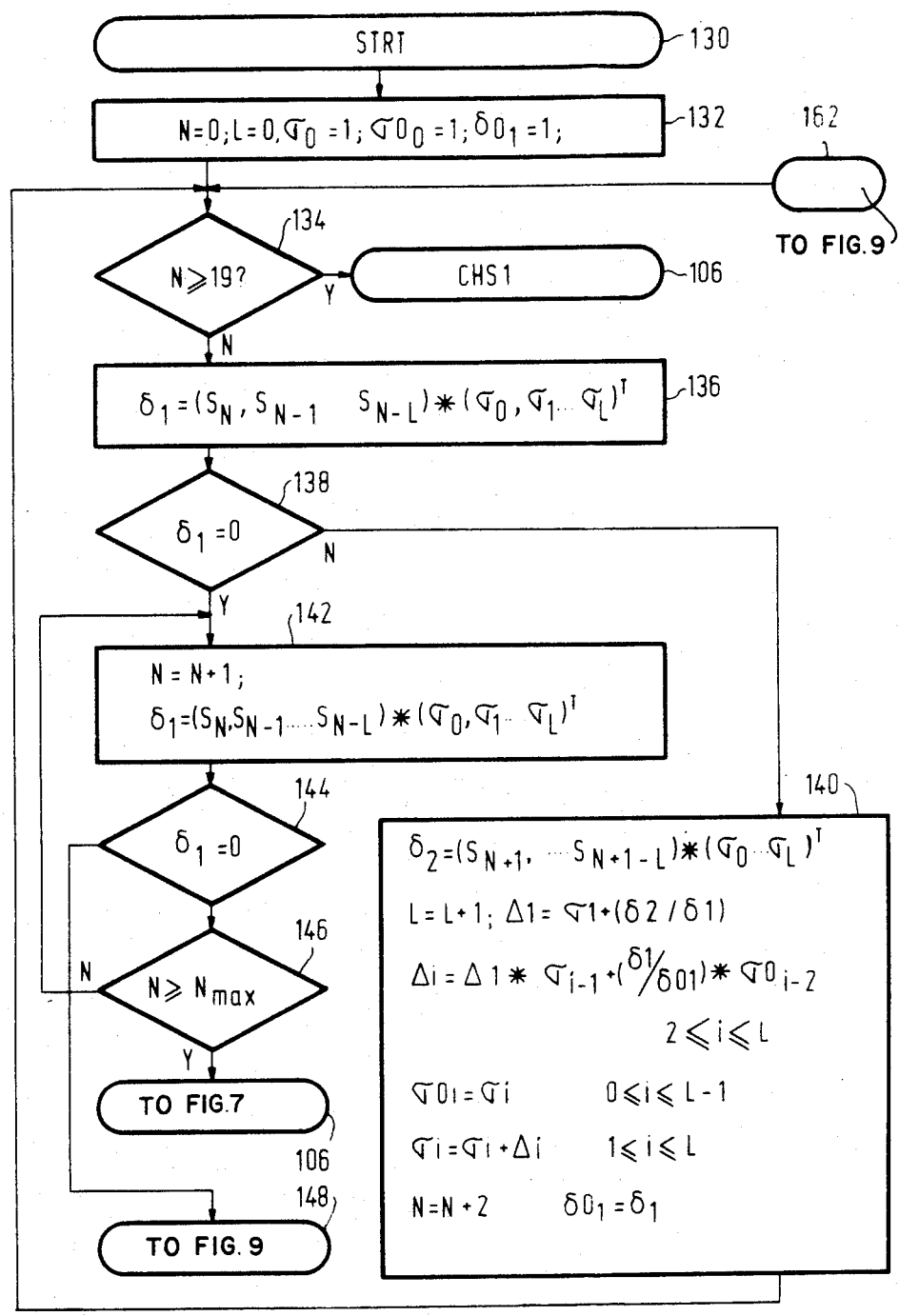
FIG. 8b shows a flowchart of a first part of the solution of this key equation.
Figure 9:
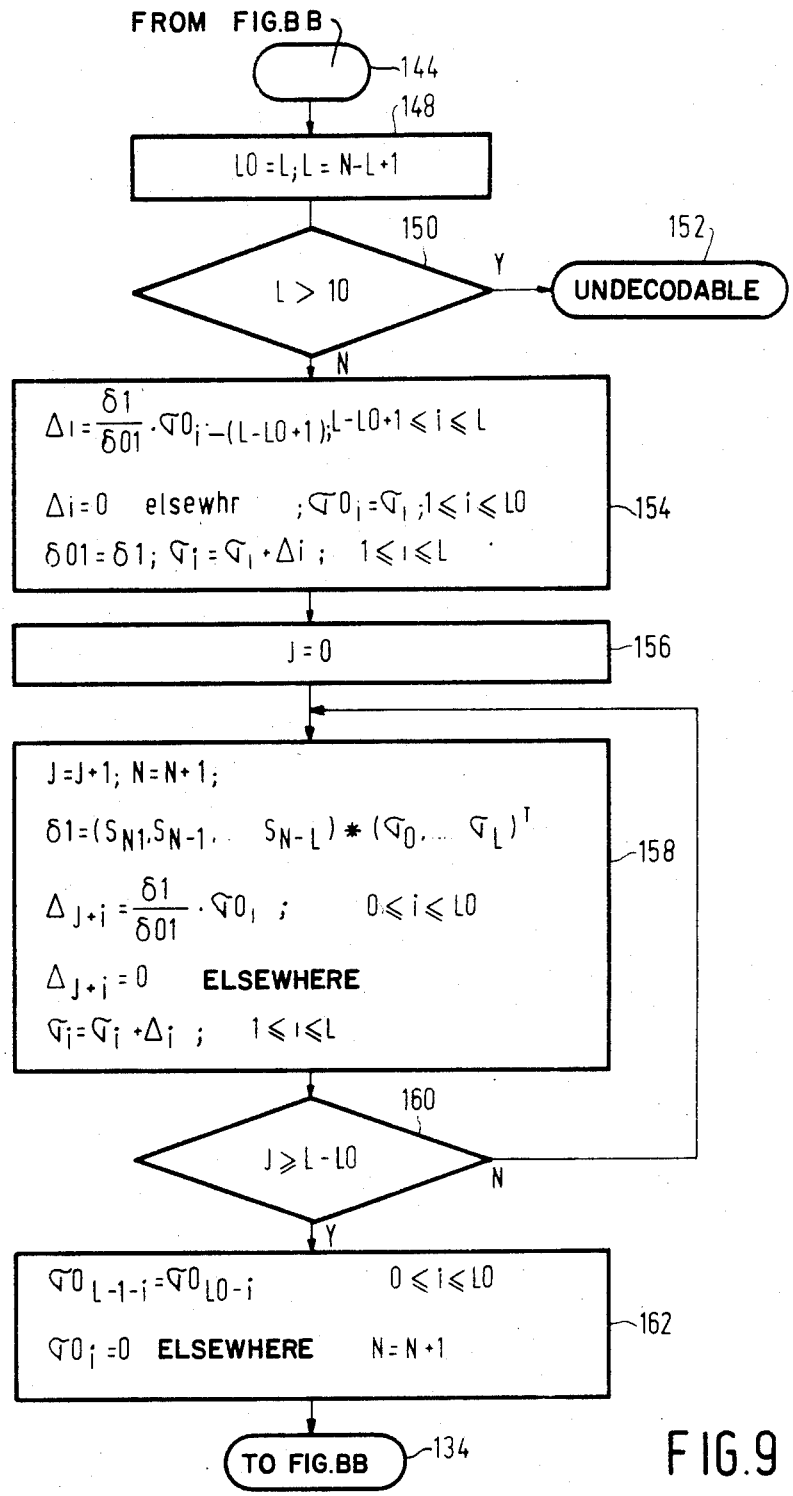
FIG. 9 shows a flowchart of the second part of the solution of the key equation.

FIGS. 8b, 9 show a detailed flowchart for the solution of the key equation (block 104 in FIG. 7). FIG. 8a shows the principle of the solution of a matrix equation according to the so-called Cramer's rule. When it is known that a product of a square matrix comprising $n \times n$ elements with an unknown vector equals a known vector, both of n elements, the elements $x1 \ldots xn$ of the unknown vector can be found by substituting each time the known vector in the column of the matrix having the same number as the unknown vector component and by dividing the determinant of the modified matrix by the determinant of the non-modified matrix. A feasible solution procedure is that this operation is performed first for the value $n=10$, which implies a very elaborate calculation. Moreover, it would have to be repeated for $n=9$, for $n=8$, etc. until the solution is found. Starting with $n=0$ and repeating the calculation for higher values of n does not save time, because it would always be necessary to continue as far as the value $n=10$, so that the procedure would even be longer. This is because only the highest value of n giving a solution is the correct one. Therefore, the described solution procedure which could be called a "brute force" method, is not chosen. Though the solution in accordance with the description starts with the value $n=0$, it also includes an inherent test for the correctness, so that the number of errors determined is very likely also the correct number. Moreover, sub-results previously calculated are always used for the calculations to be performed later, so that an additional time saving is achieved The solution of the key equation in the flowchart of FIG. 7 represents only a single processing block, so that usually further operations are required. For the solution of the key equation in accordance with the described method, only a small number of errors will be assumed and the results of this assumption will be tested against the actual syndrome configuration. The described method offers a fast solution notably when the number of actually in correct symbols in the code word is small, because only few operations are feasible. Consequently, decoding can be performed by the described microcomputer, while the processing at the level of the code words can virtually always be performed in real time with respect to the reception of the code words.

FIG. 8a again shows the formalized key equation $S(z) \times sigma(z) = omega(z)$. Therebelow the key equation is written in elements for the case involving ten symbol errors; the left-hand matrix consists of $10 \times 10$ elements in which all syndrome symbols are represented. The four further columns represent two vectors of ten elements each, the right-hand vector again being composed of syndrome symbols. For a smaller number of symbol errors occurring, the determinant of the matrix, however, equals zero, so that no solution is found. In that case a smaller matrix must be chosen. Therebelow the case involving three errors is shown. Actually, the largest matrix must be found whose determinant is just not equal to zero. At the bottom of the figure the equation for determining the second coefficient of sigma(z) is written in elements for the case actually involving ten symbol errors. In accordance with the described calculation method, however, an as small as possible matrix is used for the calculation of sigma(z) with a number of additional test steps. It is assumed that the key equation also describes a part of the further test. In order to proceed from a smaller matrix to a larger matrix, the results found are used so that only matrix incrementation steps are required for the attempted solution of the matrix equation with the larger dimension. Thus, each time only one increment of Cramer's rule is executed.

Referring to FIG. 8b again, the procedure starts in block 130; at the end thereof all syndrome symbols are available so that the key equation can be formulated. First the actual syndrome number N is made equal to zero in block 132; this is the number of syndrome symbols used thus far for the execution of Cramer's rule. This number is (therefore) equal to twice the number of symbol errors assumed thus far. The latter number is referred to as "L", which is also the order of sigma(z). Three quantities are made equal to 1, that is to say the zero coefficient sigma (0) of sigma(z), an associated auxiliary quantity Olsigma 0 and an auxiliary quantity Oldelta1 to the discrepancy quantity delta1; the auxiliary quantities serve to "save" the associated "real" quantities. Subsequently, in block 134 it is tested whether the entire series of syndrome symbols has been taken into account. If this is so, the procedure according to the FIGS. 8b, 9 has in any case been terminated and the system proceeds to the block 106 in FIG. 7 (actually to the block 110). If the test result in block 134 is negative, the system proceeds to block 136. Therein the first discrepancy delta1 is calculated as an in-product of a part of the actual syndrome vector and the transposed actual error locator; this discrepancy is, therefore, a scalar quantity. Upon the first passage, the discrepancy thus equals the first syndrome symbol. The actual syndrome vector, therefore, is the next row of the matrix in FIG. 8a during the next incrementation step. The actual error locator is then the error locator vector applicable thus far, including the coefficient sigma0. Upon the second passage, the factors comprise two terms, and so on up to a maximum value of nine.

In block 138 it is tested whether the discrepancy delta1 equals zero. If this is not so (N), the system proceeds to block 140. In the block 140 the new polynomial sigma(z) is determined which obtains an additional term upon each passage. The old coefficients are then also modified. This is effected by way of Cramer's rule as described with reference to FIG. 8a, that is to say by way of a matrix/vector dimension which is successively incremented by one unit. First the second discrepancy delta2 is calculated in the same way as the first discrepancy, be it over a series of syndrome symbols which has been shifted over 1 symbol. Furthermore, the error enumerator L is incremented and an auxiliary vector capdelta(1 ... L) is determined whose number of components equals the value of the error enumerator. The first component is determined from the first coefficient of the actual error locator, also taking into account the discrepancies. For rank number i larger than 1 the component capdelta(i) is determined from the actual component of sigma(z) of next lower rank and the component of sigma(z) of second-lower rank which has been saved during a previous calculation operation. Finally, the actual components of sigma(z) are saved and updated by way of the calculated components of capdelta of associated rank, and the number of syndrome symbols taken into account is also updated. After that the value of delta 1 is saved. The determinants of Cramer's rule are thus successively supplemented by a row + a column without complete recalculation of these determinants being necessary. The system subsequently returns to the block 134.

If the test in block 138 is positive (Y), the system proceeds to block 142. Therein, the current syndrome number (=the number of syndrome symbols taken into account is incremented. This means that an "excessively large" number of symbol errors is assumed which correspond to real symbol errors only if the positive result in the block 138 was premature. If the result in the block 138 was justified, the additional symbol errors are merely pseudo-symbol errors. Furthermore, the first discrepancy delta1 is calculated again; actually this is the same quantity as the second discrepancy in block 140. In block 144 it is tested whether this first discrepancy is zero. If the result is positive, the system proceeds to block 146 in which it is tested whether the current syndrome number exceeds or equals an upper limit Nmax. In the system this quantity is given for each value of L, being the estimated number of symbol errors; it is always larger than the number of syndrome symbols taken into account thus far in block 136. For many values of L the number Nmax is smaller than 20, for example, it exceeds the actual number N in the block 136 by a fixed amount and equals, for example $2L+4$; this choice is determined by the type of errors anticipated and the permissible risk of incorrect detection. The value of Nmax may be even as well as odd. The larger value selected for Nmax, the smaller the risk will be that an assumed value of the error enumerator is incorrect; on the other hand, when this last loop is completed only a few times, calculation time is saved. For as long as the test result in the block 146 is negative, the system each time returns to the block 142; each time the next discrepancy is then determined, the rank number of the syndrome symbols taken into account then being increased by one unit; their number always remains equal to $(L+1)$. When the upper limit for Nmax is reached, the system proceeds directly from the block 146 to the block 106 in FIG. 7. If the result in the block 144 is negative, the system proceeds to the input of FIG. 9. This completes the description of FIG. 8b.

The flowchart of FIG. 9 illustrates the second part of the solution of the key equation and is reached from the block 144 in FIG. 8b; FIG. 9 comprises a single input in block 148. The entering of this flowchart may be interpreted as a failure of the procedure followed in FIG. 8b; in practice this failure will occur only for special combinations of symbol errors. The steps shown in FIG. 9 are known per se from the book by Erwin R. Berlekamp, op cit., paragraph 7.4, page 184. The steps in accordance with FIG. 8b usually result in faster processing. Different processing blocks exhibit operations which correspond to those in the block 140 in FIG. 8b. In the block 148 the value of the error enumerator L is saved in an auxiliary variable L0, and subsequently the value of L is recalculated. Upon departure from the block 140 in FIG. 8b, N was equal to 2L, but in the block 142 the value of N has been incremented one or more times. The new value of the error enumerator thus becomes larger than the old value. In block 150 it is detected whether the value of L is larger than 10. If this is so, the system proceeds to the block 152 and it is signalled that the code word cannot be decoded. A further attempt could then be made to reconstruct the data in a different manner (for example, by fetching the entire code word again from the data source), but this type of technique has already been adequately described elsewhere. When the number of postulated errors L is still within the limits imposed, a series of capdelta quantities is determined in block 154, that is to say for all permissible values of the current quantity i. Beyond that all capdelta quantities are set to zero. Furthermore, all known coefficients of the error locator sigma(z) are saved in corresponding auxiliary variables. The first discrepancy is saved in the quantity 01delta1 and all coefficients of the error located are updated by means of the associated quantities capdelta as in the block 140.

In block 156 an auxiliary quantity J is introduced which indicates the number of incrementations of Cramer's rule and hence the number of additional syndrome symbols to be taken into account. The blocks 158, 160 form a loop. Therein, first the quantities J,N are incremented, the discrepancies are recalculated, the relevant capdeltas are updated or set to zero, and the coefficients of the error locator are updated. Finally it is detected whether the quantity J is still within the limits imposed. For as long as this is the case, the system completes the loop again. When $J=L-L0$, the loop has been completed 2 sufficient number of times. The system then proceeds to block 162 in which the series of coefficients of the error locator sigma(z) saved in the block 154 are shifted through 1 or more index locations with respect to the saved value of L, the other coefficients being set to zero. Finally, the number of syndrome symbols taken into account is incremented and the system returns to the block 134 in FIG. 8b. This completes the description of FIG. 9 and also the solution of the entire key equation. The sole output adjacent the block 152 leads to the block 106 in FIG. 7. The blocks 106 and 108 and 124 in FIG. 7 will not be elaborated.

Figure 10:
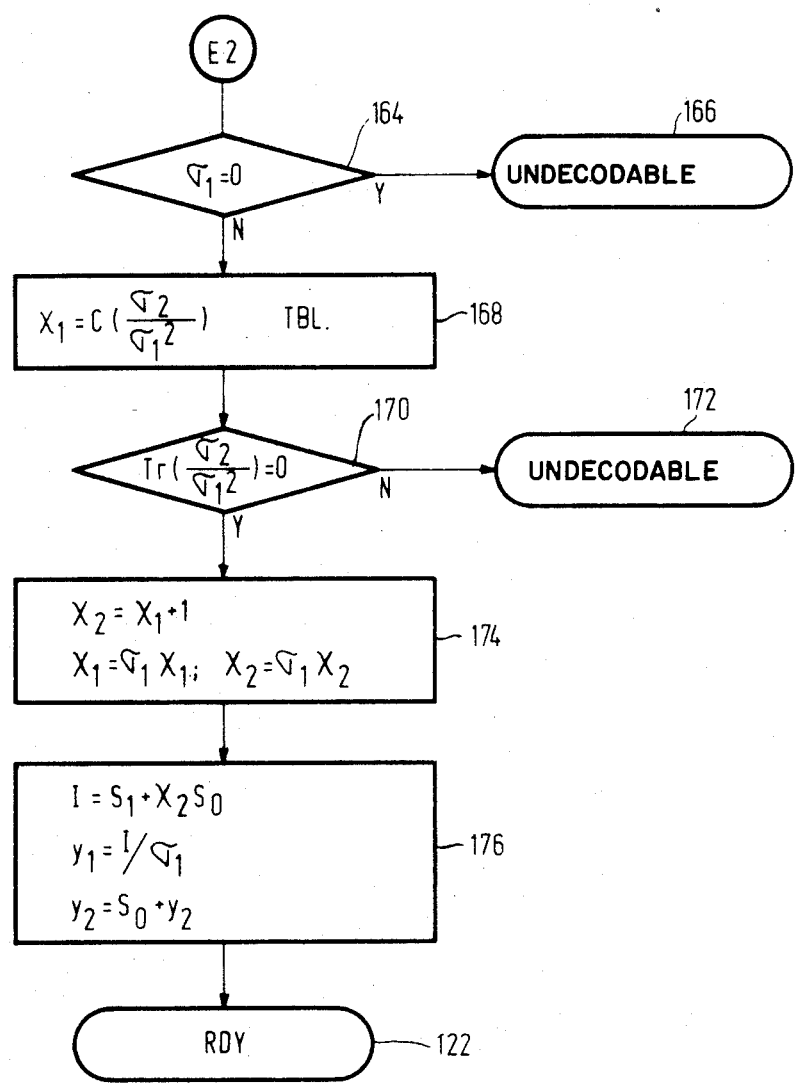
FIG. 10 shows a flowchart for the solution of a second-order equation.

FIG. 10 is a detailed representation of the block 126 of FIG. 7 for determining two error symbols. The sole input leads to the block 164. Therein it is tested whether the coefficient sigma1 of the error locator sigma has the value zero. This would mean that the errors coincide and that is impossible because of the chosen definition of "incorrect". If the test result in the block 164 is positive, the code word is considered to be non-decodable in block 166. The block 166 thus corresponds to the block 152 of FIG. 9. Another procedure which can always be performed is to jump and return to the block 146 in FIG. 8b, so that a number of additional discrepancies can be tested. When the test result in the block 164 is negative, a first proto-error position CHi1 is determined in the block 160; this is performed by means of a table which is stored in element 368 in FIG. 6 as described. The proto-error position is related to the real error position, but the error position cannot yet be determined at this stage of the procedure. In block 170 the trace quantity of the relevant coefficient is tested; this is a conventional operation. If this trace is not equal to zero, the system proceeds to block 172 and the code word is considered to be non-decodable. In that case a jump may again be made to the block 146 in FIG. 8b; a further step must then be taken in order to ensure that the system cannot infinitely remain in a loop thus formed. When the test result in the block 170 is positive, the error can be determined. First the final error positions are determined in block 174 by incrementation in $GF(2^8)$ of the first proto-error position Chi1 and multiplication by the coefficient sigma1 of the error locator, sigma(Z). For example, if Chi=$a^i$, the code symbol having the rank number (i) is incorrect. In block 176 first the provisional error value I is determined at therefrom the actual error value is determined by way of the coefficient sigma1 and the syndrome symbol S0. The block 122 has already been described with reference to FIG. 7. The block 176 actually represents the blocks 110 and 120 for this number of symbol errors.

Figure 11:
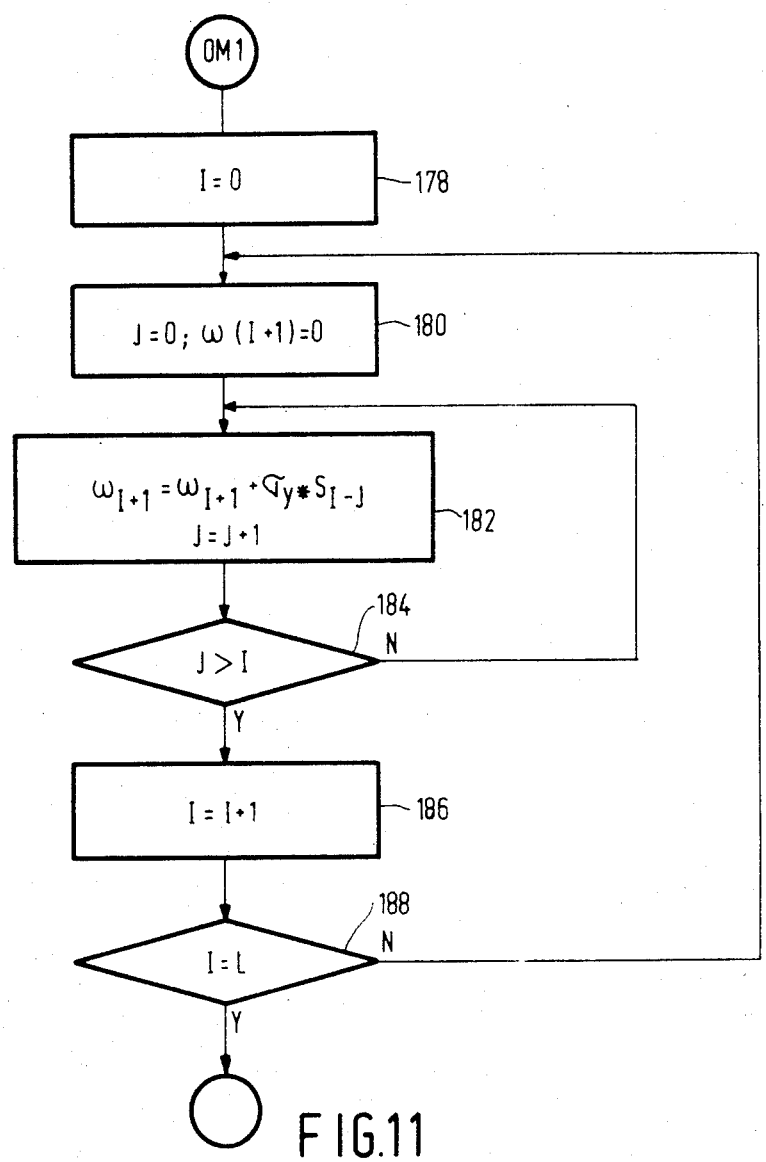
FIG. 11 shows a flowchart for determining the error evaluator.

For a larger number of symbol errors, first the error evaluator omega(z) is determined as shown in FIG. 11 (see the block 110 in FIG. 7). The error evaluator is determined as the product of the syndrome polynomial S(z) and the error locator polynomial sigma(z), so that omega1=S1×sigma0+S0×sigma1; omega2=S2×sigma0+S1×sigma1+S0×sigma2, etc. The process comprises a single input in block 178; therein, the auxiliary quantity I is set to zero. In block 180 a second auxiliary quantity J is set to zero, and also 1 provisional coefficient of the error evaluator. The quantities I and J are rank numbers and have no physical significance. The blocks 182, 184 form a loop in which each time 1 coefficient of the error evaluator polynomial is updated and the auxiliary quantity J is incremented. When J becomes larger than I, the relevant coefficient has been completely determined and in block 186 the value of I is incremented in order to proceed with the next coefficient of the error evaluator polynomial. When the values of I and L are equal, the entire polynomial has been determined and the system proceeds to the block 112 in FIG. 7.

Figure 12:
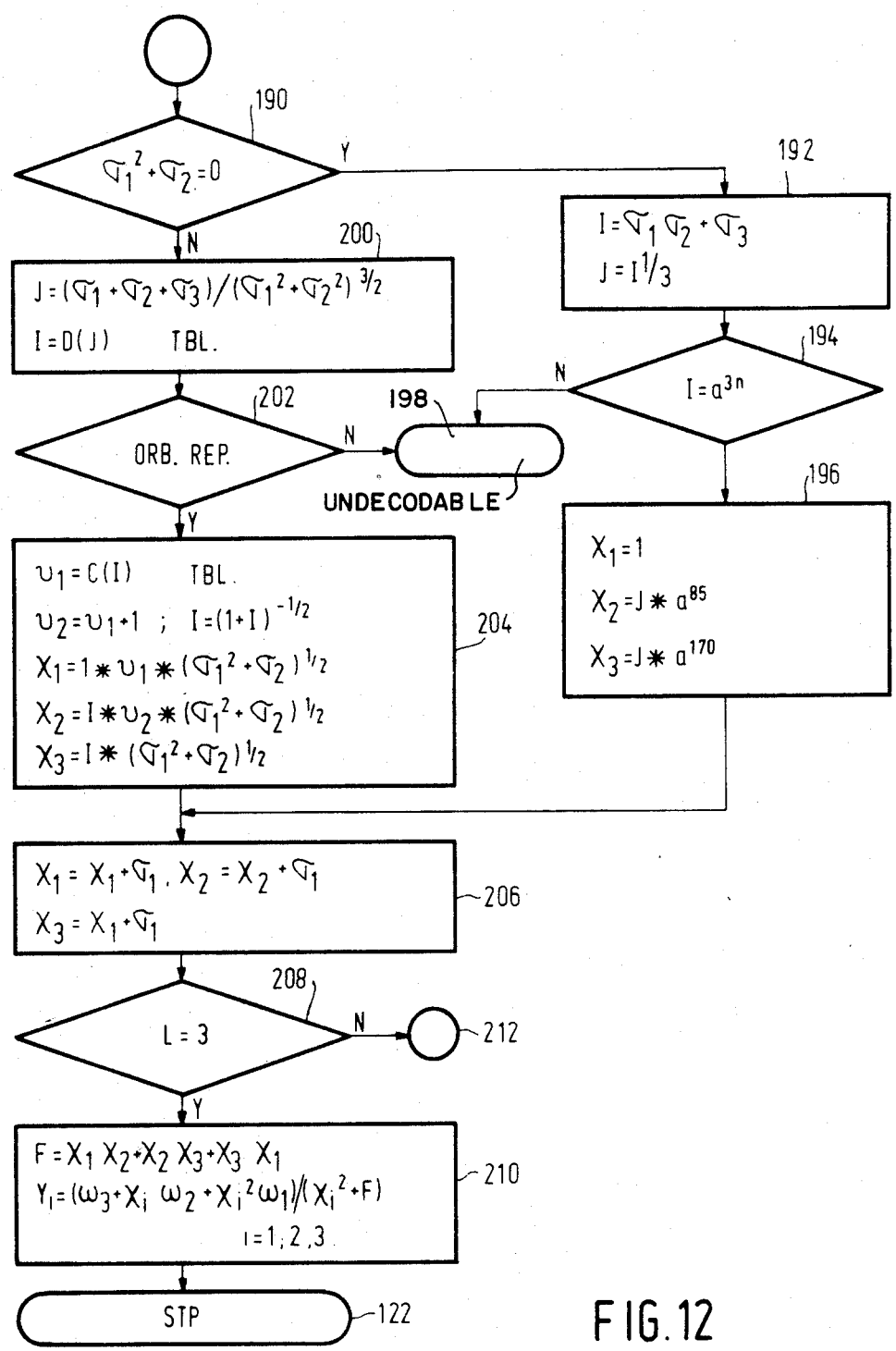
FIG. 12 shows a flowchart for the solution of a third-order equation.

FIG. 12 shows a flowchart for the solution of the cubic equation, see the block 118 in FIG. 7. The solution of second-order and third-order equations in a Galois field itself has been described in an article by R. T. Chien, IEEE Transactions on Information Theory, March 1969, p. 329 ff. This article also states the solutions for equations of the fourth and fifth order, but the solutions are not used in the described preferred embodiment. The figure shows a single input in block 190 which is reached from one of the blocks 112, 116 in FIG. 7; for the sake of simplicity, the latter blocks will not be elaborated. In block 190 first the second and the third coefficient sigma (1,2) of the error locator polynomial are tested. If this test is positive, the system proceeds to the block 192. Therein, an auxiliary quantity 1 and an auxiliary quantity J1 are successively determined; these quantities are elements of a Galois field. The latter determination is again performed by means of a table (element 368). In block 194 it is tested whether the quantity I equals a power (3n) of the primitive element a of the Galois field. If this is not the case, the system proceeds to block 198 and the code word is considered to be non-decodable. If the test in the block 194 is positive, the system proceeds to the block 196 and the three different provisional error locations Chi, 2, 3 are provisionally determined. The system subsequently proceeds to block 206.

If the test result in the block 190 is negative, the system proceeds to block 200. Therein a value is calculated for the auxiliary quantity J in the indicated manner, and therefrom a value is calculated for the auxiliary quantity I by means of a function translation table indicated by "D". This translation table is again stored in the element 368 in FIG. 6. In block 202 it is tested whether a so-called orbital representation, is concerned. (This representation is described in detail in said article). If the answer is negative, the system proceeds to the block 198 and the code word is considered to be non-correctable. If the test result in block 202 is positive, the system proceeds to block 204. First a first auxiliary quantity nu1 is determined by means of said C-table and therefrom a second auxiliary quantity nu2 is determined. Subsequently, the already described auxiliary quantity I is updated (block 200). Finally, in this block the provisional positions of the three errors are determined. The system subsequently proceeds to the block 206 which was also reached from the block 196. In the block 206 the provisional positions of the three errors are updated by way of the second coefficient of the error locator sigma(z) in order to obtain the final positions; the system then proceeds to block 208. In the block 208 it is tested whether the error enumerator has the value 3, it thus being tested whether a Chien search cycle has taken place before this point of the procedure was reached. All errors are now known and the system proceeds to block 210. Therein, first the auxiliary quantity F is determined. Subsequently, the error values Y(1, 2, 3) are determined by means of the coefficients omega (1, 2, 3) of the previously determined error evaluator and the actual error positions x(1, 2, 3). The relevant code word has now been completely treated. The block 210 actually represents a faster version of the processing in the block 120 for three errors.

Figure 13:
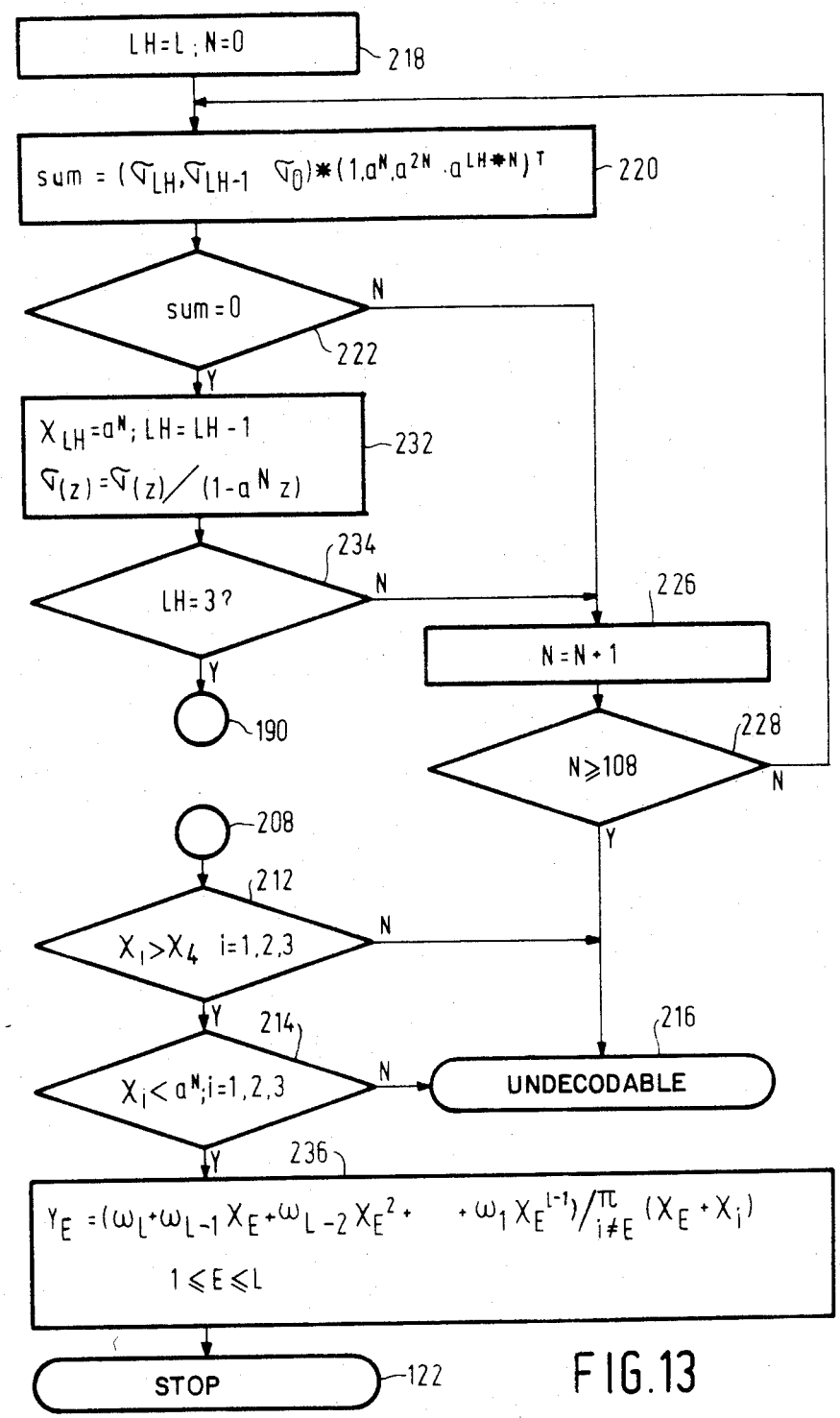
FIG. 13 shows a flowchart for executing a Chien search operation and for determining the error values.

A first part of FIG. 13 represents the actual Chien search operation. The input block of this section is formed by a block 218 and is reached from the block 188 in FIG. 11, subject to the condition that the order of the error locator sigma(z) is larger than 3. If this is not so, the system proceeds to the block 190 in FIG. 12. First the auxiliary error enumerator is made equal to L and the number N of code symbols tested is set to zero. Subsequently, the quantity "sum" is determined. This is because the inverse values of the roots of the error locators sigma(z) indicate the error locations; similarly, however, the roots of the error locator with an inverse coefficient series (inverse polynomial) also produce the error locations. After this determination in the block 220, the value of the quantity "sum" is tested in block 224. For as long as the value of this quantity "sum" remains different from zero, a loop is completed which consists of the blocks 224, 226, 228, 220. Therein, each time the number of code symbols tested is incremented and the quantity "sum" is recalculated. The relevant code word is considered to be non-decodable in the block 216 only if the value of N exceeds the permissible length of the code words. When the quantity "sum" becomes zero during the passing through the loop (which may take place as many as 100 times in given circumstances, i.e. a number of times equal to the length of the code word in symbols reduced by 3), an error symbol has been found in such a Chien search cycle and the relevant root of the error locator can be removed by division. First the error locator of the relevant incorrect symbol is laid down in block 232, after which the auxiliary error enumerator is decremented by one unit and finally the order of the error locator is reduced by division. In block 234 it is tested whether the auxiliary error enumerator has the value 3. For as long as the result of this test is negative, the system (each time) returns to the block 226; thus, the incorrect symbols are found in a progressing order in the code word. A differently programmed order would be just as good, however. When the test result in the block 234 is positive, the system proceeds to the block 190 in FIG. 12. When all error locations have been found, the incorrect symbols are determined in block 236. The code word has then been completely treated. The block 236 actually performs the operations in the block 120 for a number of errors amounting to four or more.

On the other hand, if the test result in the block 208 in FIG. 12 is negative, more than three errors are involved and the system proceeds to the block 212 in FIG. 13. This means that at this instant all errors have been found (the last three in the part of FIG. 12 just completed), but that the block 210 is not applicable. All errors must now be elaborated. The input block 212 is an input of FIG. 13 other than that used by the blocks 134, 146 in FIG. 8. In block 212 it is tested whether each of the first three error locations is larger than the fourth. If the test result is positive, it is tested in block 214 whether all three error locations are within the considered maximum length of a code word of n code symbols (for example, 108 symbols in one embodiment). If one of the two test results in the blocks 212, 214 is negative, the system proceeds to the block 216 and the relevant code word is considered to be non-decodable. If both test results are positive, the system proceeds to the block 236 in order to calculate the error values for all symbol errors found (at least four and no more than ten in the present embodiment). The system subsequently proceeds to the block 122, thus completing the treatment of the relevant code word.

What is claimed is:

1. A decoding system for decoding multisymbol code words that are protected by means of a Reed-Solomon code against occurrence of multiple symbol errors within one code word, said system comprising:
    a. receiving means for sequentially receiving the code symbols of a code word;
    b. first calculating means fed by said receiving means and comprising a first multiplier for generating a series of syndrome symbols for a code word by means of multiplication with the parity check matrix (H) of the code;
    c. second calculating means (104) fed by the first calculating means and having sequencing means for sequentially accessing a series of first to eighth program steps, to wit:
        c1. a first program step for assuming L=0 symbol errors in
the actual word for thereupon accessing a second program step;
        c2. the second program step for activating a second multiplier for solving for the actually postulated number of L symbol errors by means of the first N=2L syndrome symbols a key equation that is limited to those N syndrome symbols, according to Cramer's rule and for thereupon accessing a third program step;
        c3. the third program step for determining the value of the discrepancy delta 1 and for thereupon accessing a fourth program step;
        c4. the fourth program step for determining a non-zero value of delta 1 (138) and thereupon re-accessing the second program step while incrementing the current value of L and repeating the solving of the key equation by means of matrix incrementation operations, but upon determination a zero value of delta 1 (138) accessing a fifth program step;
        c5. the fifth program step for incrementing the number N by way of postulating a quasi-symbol error and recalculating the value of the discrepancy delta 1 as based on any current symbol errors and quasi-symbol errors, and for thereupon accessing a sixth program step;
        c6. the sixth program step for determining a non-zero discrepancy delta 1 for thereupon accessing the third program step while supplementing the key equation for any actual quasi-symbol error then operating as additional symbol error but for otherwise accessing a seventh program step;
        c7. the seventh program step for comparing the actual value of N with a predetermined value Nmax given by the current number of non-quasi symbol errors and for a too-low value of N accessing the fifth program step but for a sufficiently high value of N accessing an eighth program step;
        c8. the eighth program step for in case the key equation featuring at least a predetermined number of symbol errors obtaining the error locator sigma (Z) and the error evaluator omega (Z);
    d. third calculating means fed by said second calculating means for determining any zero point of the error locator to obtain corresponding positions of code symbols liable to be incorrect;
    e. fourth calculating means fed by said third calculating means for determining from said zero points any symbol error associated with incorrect code symbols, which incorrect code symbols are correctable through combination of error value and associated position data.

2. A decoding system as claimed in claim 1, wherein said second calculating means have first detection means (106, 108) for prior to entering step c8 detecting a number of at most two symbol errors, an output signal of said first detection means then controlling a first state of said second calculating means for directly solving (124, 126) an error locator equation of at most second order to localize and evaluate any error directly, an alternative output signal of said first detection means in case of a higher number of symbol errors controlling a second state of said second calculating means for then entering execution of step c8.

3. A decoding system as claimed in claim 2, wherein said third calculating means have second detection means for detecting a found number of three symbol errors, an output signal of said second detection means then controlling a third state of said third calculating means for therein solving a cubic error locator equation, localizing the errors, and assigning error values to any error thus found, an alternative output signal of said second detection means in case of a higher number of symbol errors then controlling a fourth state of said third calculating means, for in said fourth state executing the following program steps:
    d1. a ninth program step for implementing a Chien search cycle over the series of code symbols until a symbol error is localized for thereupon accessing a tenth program step;
    d2. the tenth program step for removing (114) the factor constituted by said localized symbol error from the error locator by division so that the actual number of remaining symbol errors is decremented, and thereupon accessing an eleventh program step;

d3. the eleventh program step for detecting whether the number of remaining errors surpasses a second predetermined number and in the positive case re-accessing the ninth program step but in the negative case accessing a twelfth program step;

d4. the twelfth program step for directly solving (118) the error locator equation.

4. A decoding system as claimed in claims 1, 2 or 3, characterized in that said first calculating means comprise a loop which includes a series connection of an EXCLUSIVE-OR circuit (306, 308) for receiving the code symbols, a buffer (312,314) for storing the (provisional) syndrome symbols formed for a code word, and a read-only memory (320, 322, 324) for the storage of the multiplication tables for the parity check matrix, an output of said read-only memory being fed back to a further input of the EXCLUSIVE-OR circuit, a further output (316) of the buffer being connected to the second calculating means in order to apply thereto the series of final syndrome symbols upon completion of the treatment of the relevant code word.

5. A decoding system as claimed in claim 4, characterized in that for the detection of the last code symbol of a code word on the basis of an appended signal bit there is provided a signal detector, an output of which activates the further output (316) in order to enable said circuit for the reception of a next code word.

6. A decoding system as claimed in any one of claims 1, 2 or 3, characterized in that the second, third and fourth calculating means are realized by means of a calculating circuit which comprises: an input buffer (338, 340) for the storage of at least the complete series of syndrome symbols generated for a code word, a microcomputer (352), an output buffer (348, 350) for the storage of a series of error locator and error evaluator symbols generated for a complete series of syndrome symbols associated with a code word, and a bus (344) which is connected between these components and whereto there is also connected a log/antilog table device (364, 368) for executing multiplication operations on the symbols in the relevant Galois field, and a data memory (370) for which addresses can be supplied by the microcomputer via the bus and also by a counter (380, 382) which can be incremented by an external clock generator.

7. A decoding system as claimed in claim 6, characterized in that also connected to the bus is a detector (362) for detecting a correct code word by detection of a series of syndrome symbols associated with a code word and containing exclusively "zero" symbols, and without using the microcomputer, a next series of syndrome symbols being subsequently called.

8. A decoding method for the decoding of multi-symbol code words, which are protected by means of a Reed-Solomon code against occurrence of multiple symbol errors within a code word, said method comprising the steps of:

a. sequentially receiving all code symbols of a code word;

b. multiplying the code word with the parity check matrix (H) of the code for thereby generating a series of syndrome symbols for the code word in question;

c. assuming L=0 symbol errors in the code word in question;

d. for the postulated number of L symbol errors by means of the first N=2L syndrome symbols solving a key equation, which is limited to those N syndrome symbols, according to Cramer's rule (140);

e. determining the value of the discrepancy delta 1;

f. in case of a non-zero value of delta 1 returning to step d by means of incrementing the value of L and repeating the solving of the key equation by means of matrix incrementation operations, and re-executing step e;

g. but in case of a zero discrepancy delta 1 (138) incrementing the number N further by way of postulating one additional quasi-symbol error and re-calculating the value of the discrepancy delta 1 as based on any current symbol-errors and any quasi-symbol error;

h. as long as a zero discrepancy is found, re-executing step g until a predetermined value is reached for N=Nmax as depending on the current number of symbol errors whereupon the solution for the key equation is considered correct;

i. but in case a non-zero discrepancy is found in either of steps g, h, supplementing the current key equation for any quasi-symbol as postulated, the latter then operating as additional symbol error and returning to step d;

j. and in case of a correct solution for the key equation featuring at least a predetermined number of symbol errors calculating the error locator sigma (Z) and the error evaluator omega (Z);

k. determining any zero point of the error locator to obtain the position data of possibly incorrect code symbols;

l. from said zero point(s) determining any symbol error associated with an incorrect code symbol, the latter being correctable from the associated combination of error value and position data.

9. A decoding method as claimed in claim 8, wherein in step j for at most two symbol errors the error location equation of at most second order is solved directly to thereby localize any error directly without use of the error evaluator, and wherein said predetermined number is greater than two.

10. A decoding method as claimed in claim 9, wherein in step k for only three symbol errors a cubic error locator equation is solved for localizing any symbol error and thereafter assigning an error value to any symbol error thus localized, but in case more than three symbol errors are present a Chien search is implemented over the series of code symbols of the code word in question until a symbol error is localized, after which the factor represented by the symbol error thus found is removed (114) from the error locator by division, so that the actual number of remaining symbol errors is decremented, the error locator equation being solved directly (118) upon reaching a predetermined number of remaining symbol errors.

11. A reading device for reading an optically readable record carrier, said record carrier comprising a storage track for storing code words that are protected against multiple symbol errors by a Reed-Solomon code, said reading device comprising positioning means for accommodating said record carrier, drive means for rotating the record carrier about its axis of rotation at a substantially uniform speed, read means for reading a series of data bits from said storage track as representing a said code word, series-to-parallel conversion means fed by said read means to convert a bit series to a succession of code symbols, a decoding system as claimed in any of claims 1, 9, 10, 5 and 7 fed by said serial-to-parallel conversion means and representing a subsystem of said reading device, an output of said fourth calculating means being an output of said reading device.

* * * * *